United States Patent [19]

Szente et al.

[11] Patent Number: 4,943,764
[45] Date of Patent: Jul. 24, 1990

[54] WIDE DYNAMIC RANGE RADIO-FREQUENCY POWER SENSOR

[75] Inventors: Pedro A. Szente, Los Altos; Russell B. Riley, Portola Valley, both of Calif.

[73] Assignee: Hewlett-Packard Company, Palo Alto, Calif.

[21] Appl. No.: 131,867

[22] Filed: Dec. 11, 1987

[51] Int. Cl.$^5$ ................. G01R 15/10; G01R 21/04
[52] U.S. Cl. .................................. 324/95; 324/114; 324/115; 324/132
[58] Field of Search ............... 324/115, 95, 58 R, 131, 324/114, 433, 110, 132; 455/67, 115, 226; 364/483; 340/661

[56] References Cited

U.S. PATENT DOCUMENTS

| | | | |
|---|---|---|---|
| 2,518,926 | 8/1950 | O'Neal | 324/95 |
| 3,037,167 | 5/1962 | Hovda et al. | 324/95 |
| 3,040,252 | 6/1962 | Novak | 324/95 |
| 3,187,323 | 6/1965 | Flood et al. | 324/115 |
| 3,755,735 | 8/1973 | Biagi et al. | 324/95 X |
| 4,263,653 | 4/1981 | Mecklenburg | 364/483 X |
| 4,341,994 | 7/1982 | Kawasaki et al. | 324/115 X |
| 4,360,865 | 11/1982 | Yasumura et al. | 324/95 X |
| 4,488,110 | 12/1984 | Shirey et al. | 324/433 |
| 4,647,848 | 3/1987 | Barrett | 324/95 X |
| 4,739,515 | 4/1988 | Herzog | 455/67 X |
| 4,743,842 | 5/1988 | Langone et al. | 324/433 |

Primary Examiner—Reinhard J. Eisenzopf
Assistant Examiner—Vinh P. Nguyen
Attorney, Agent, or Firm—William H. F. Howard

[57] ABSTRACT

A wide dynamic range radio-frequency power sensor having a low-power sensor portion and a high-power sensor portion is described. Both sensing portions are connected to an input signal at the same time without the use of a signal splitter. In the preferred embodiment, a single radio-frequency load serves both sensor portions. Each sensor portion has its own output terminal. The low-power sensor portion includes a pair of diodes. The high-power sensor portion (which includes the radio-frequency load) may include a pair of diodes preceded by an attenuator, or a pair of thermocouples.

32 Claims, 5 Drawing Sheets

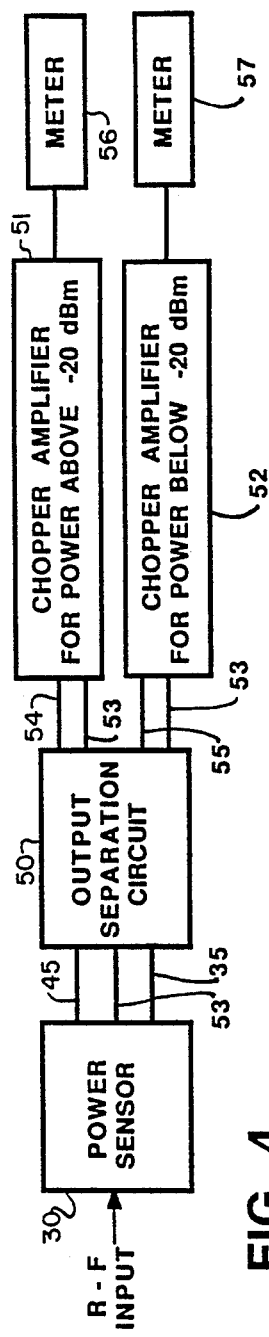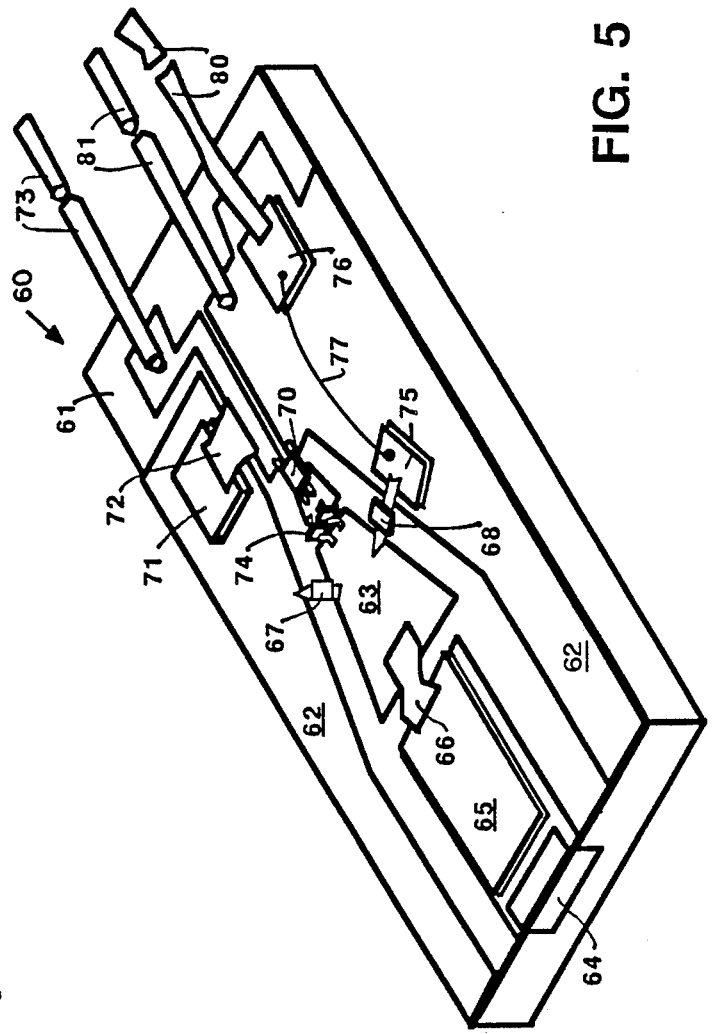

WIDE DYNAMIC RANGE RADIO-FREQUENCY POWER SENSOR

The present invention relates to a wide dynamic range radio-frequency power sensor. The present invention further relates to a radio-frequency power sensor composed of two or more sensing elements, each handling a different power level range, but sharing a common radio-frequency load.

BACKGROUND OF THE INVENTION

Some radio-frequency power sensors employ thermocouples in order to measure power at the higher levels, e.g., from about −20 dBm to about +20 dBm. However, these thermocouple sensors are not satisfactory for measuring power in the lower level ranges, below about −20 dBm. Power sensors employing diodes are often used for measuring power in this lower level range, but such diode sensors have disadvantages for measuring power in the higher ranges.

As a result, the prior art has required the use of two separate sensors to cover accurately the entire range from about −70 dBm to +20 dBm. In an automated system these two sensors often have been connected to the measuring port simultaneously by means of a broadband, precision radio-frequency power splitter. The losses of the power splitter were usually about six decibels, and these losses raised the lower level of the operating range of the low-level sensor. Moreover, additional error correction was required to account for the introduction of the splitter.

Another scheme from the prior art is to use a low power level diode type sensor at the high power levels also, and then apply correction factors to account for departures from a true square-law characteristic. This scheme does not truly measure power at the high levels, resulting in errors, which are influenced by the waveform of the signal being measured.

An object of the present invention is to increase the accuracy over a wide range of power measurement.

Another object of the invention is to provide a power measuring system with a wide dynamic range which successfully combines into a single instrument both a high power level sensing element and a low power level sensing element.

Another object of the invention is to provide a superior wide dynamic range radio-frequency power sensor, which is substantially unaffected by ambient temperatures.

A further object of the invention is to provide a wide dynamic range radio-frequency power sensor in which a switch-over between a high power level sensing element and a low power level sensing element is achieved without loss of stability or accuracy and without disturbing the input radio-frequency port.

A further object of the invention is to provide a wide range radio-frequency power sensor which is a true square-law device whose accuracy is unaffected by the waveform of the signal being measured.

SUMMARY OF THE INVENTION

The invention provides a wide range radio frequency power sensor having both a low power level sensing element and a high power level sensing element. Both sensing elements are connected to the input signal at the same time without the use of a splitter. The load of one of the sensing elements serves as the common load for both sensing elements.

The low power sensing element employs a pair of microwave semiconductor diodes. The high power level sensing element employs either a thermocouple sensing element or a sensing element comprising a pair of microwave diodes preceded by a resistive attenuator. The high level sensing element provides the impedance match to the input radio frequency signal over the full operating range. The microwave diodes may be, for example, low-barrier Schottky diodes or planar doped epitaxial low barrier gallium arsenide diodes. Unwanted thermoelectric voltages generated in the diode pairs tend to cancel, so that the radio-frequency induced output is stable and accurate. The low power level sensor and the high power level sensor are always connected to the radio-frequency input. Switching the input between the two component sensors is not needed between ranges. Switching is done instead at their respective d-c output ports, so that the input radio frequency port is left undisturbed. Each sensor is used in the square-law region of its own input-to-output response characteristic.

This new sensor provides measurement of radio-frequency power over a nine decade range without changing power sensors and is particularly useful in automated systems. The new sensor is a square-law device and is therefore a true power-measuring sensor, its accuracy being independent of the waveform of the signal measured.

The circuit topology of the components of the sensor may be arranged so that its outputs can drive either single-ended or balanced electronic amplifiers.

In summary, the wide dynamic range radio-frequency power sensor of this invention comprises an input port connected to both a low power level diode sensor portion and a high power level sensor portion. The high level sensor portion forms the radio-frequency load for the input port. Thus, both portions of the sensor are always connected to the radio-frequency input port.

The high level sensor portion may be built with thermocouples or with diodes. When the high level part of the sensor is built with diodes, a radio-frequency attenuator is included between these diodes and the input port.

Other objects, advantages, and features of the invention will be brought out from the following description.

BRIEF DESCRIPTION OF THE DRAWINGS

FIG. 4 is a block diagram of a circuit embodying the principles of the invention.

FIG. 5 is a view in perspective of an alternative form of power sensor embodying the principles of the invention and employing a thin film substrate.

DESCRIPTION OF A PREFERRED EMBODIMENT OF THE INVENTION

Figure 1:
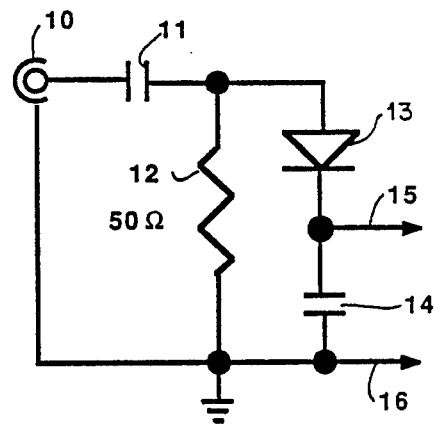
FIG. 1 is a circuit diagram of a prior-art diode power sensor.
Figure 2:
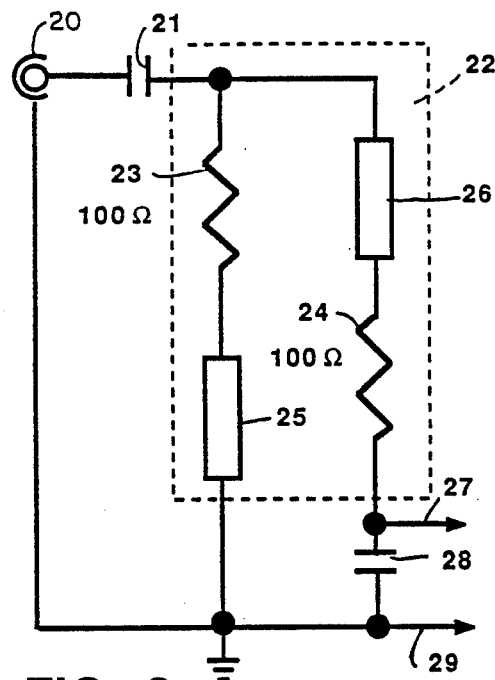
FIG. 2 is a circuit diagram of a prior-art thermocouple power sensor.

THE PRIOR ART SYSTEMS (FIGS. 1 and 2)

FIG. 1 shows a prior art low level power sensor. An input port 10, one side connected to ground, is connected by a d-c blocking, coupling capacitor 11, to a characteristic impedance matching load 12, i.e., a $R_0$ resistor, and to a microwave diode 13. The other side of diode 13 is connected to a d-c output line 15. A radio-frequency bypass capacitor 14 is connected between line 15 and ground. Another output line 16 is connected to ground. The diode 13 may be a low barrier Schottky diode or a planar doped epitaxial low barrier gallium arsenide diode. The output is adequate to detect low-level power.

Circuits like that of FIG. 1 have true square-law response only for signals less than about −20 dBm. The diode detector 13 charges the capacitor 14 with a voltage that is proportional to the square of the radio-frequency voltage developed across a 50-ohm resistor 12. Thus, it measures the power dissipated by the 50 ohm resistor 12 in a range of about −70 dBm to −20 dBm.

FIG. 2 shows a high-level power sensor according to the prior art. An input port 20 is connected by a radio-frequency coupling capacitor 21 to a thermocouple sensor assembly 22. The assembly 22 comprises a pair of thin film resistors 23 and 24 of identical value, typically 100 ohms each, combined with a silicon conductive film 25 and 26, or other conductive material suitable to form the other material of the thermocouple sensor 22. A d-c output 27 is between the thermocouple 22 and a radio frequency filter capacitor 28. A second output line 29 (ground) is on the other side of the capacitor 28. This circuit is successful in measuring high level radio-frequency power.

Square-law sensors have been made like the circuit of FIG. 2, employing tantalum nitride resistors 23 and 24 and doped n-type silicon films 25 and 26. The resistors 23 and 24 are also the matched load for the applied microwave power. The resistors may have a value of 100 ohms each, so that the radio frequency load (with the two thermocouple resistors 23 and 24 in parallel) is 50 ohms. This thermocouple sensor operates according to the square-law up to about +20 dBm. Below about −30 dBm its output is too low to be useful.

Heretofore, attempts to combine a system like that of FIG. 1 with a system like that of FIG. 2 employed a power splitter designed to feed both inputs 10 and 20 simultaneously, resulting, as said above, in significant reduction of sensitivity and accuracy.

A SENSOR 30 OF THE PRESENT INVENTION (FIG. 3)

Figure 3:
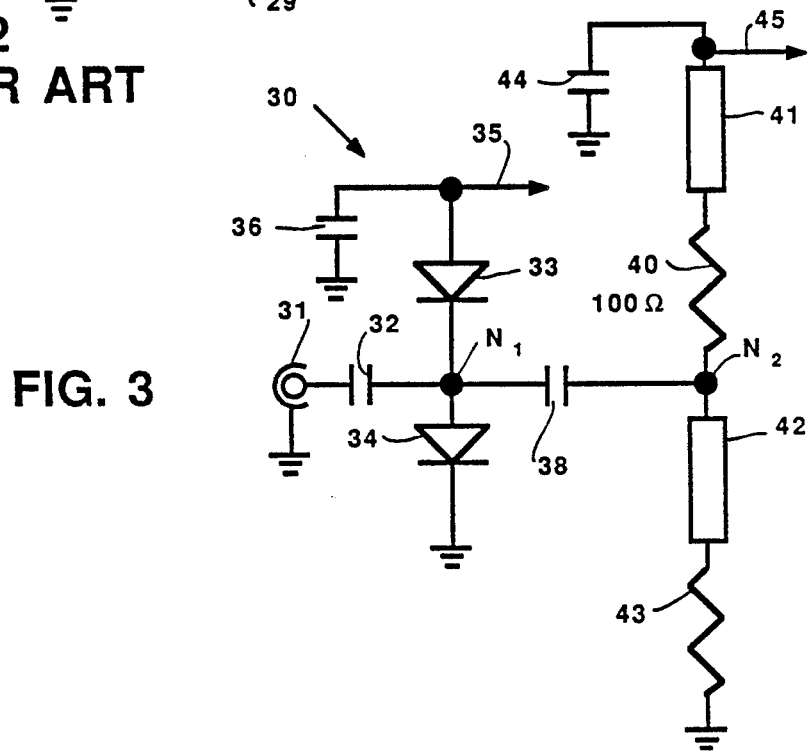
FIG. 3 is a circuit diagram of a wide-range power sensor embodying the principles of the present invention.

FIG. 3 shows the circuit of a full-wave radio-frequency power sensor 30, especially useful with microwave power, in which unwanted electrical outputs due to thermoelectric effects associated with the diodes cancel (or balance out) and is not a simple addition of FIGS. 1 and 2. The circuit of FIG. 3 has a single input port 31, one side of which is grounded and is connected by a coupling (i.e., d-c blocking) capacitor 32 to a pair of identical diodes 33 and 34 connecting to the cathode of diode 33 and the anode of diode 34. The anode of diode 33 is connected to a grounded capacitor 36 with a node 35 being a d-c output. The cathode of diode 34 is connected to ground. The capacitor 36 may comprise two or more capacitors in parallel.

Beyond the diodes 33 and 34, which join at node N1, coupling capacitor 38 connects node N1, to node N2. Node N2 also connects to two thermocouples (made of thin film resistors 40 and 43, and silicon thin films 41 and 42). The silicon film 41 is connected to a grounded capacitor 44, with a node 45 being a d-c output, while the resistor 43 is grounded. The capacitor 44 may comprise two or more capacitors in parallel.

The d-c output 35 is for the measurement of low-level radio-frequency power, and the d-c output 45 is for the measurement of high-level radio frequency power.

One of the features of a two element thermocouple power sensor is that thermocouple voltages generated by a thermal gradient common to both elements cancel, while gradients generated by radio-frequency power are opposite and the voltages produced thereby add. This action causes the thermocouple power sensor to be relatively insensitive to ambient temperature changes.

A similar effect is obtained in the diode power sensor as a result of introducing the second diode 34, which cancels thermally induced (that is, thermoelectric) voltages arising in the diode 33. The thermal environments of diodes 33 and 34 are made as similar as possible.

The matched load for the input radio-frequency port 31 is the load resulting from the parallel combination of the resistors 40 and 43.

To summarize, FIG. 3 shows a sensor circuit suitable to drive single ended electronic amplifiers. In the low power level portion, one side of each of the diodes 33 and 34 connects to node N1, which, in turn, is connected to the input port via capacitor 32. The other side of diode 33 connects to output means 35; the other side of diode 34 connects to ground. Capacitor 38 connects node N1 of the low power level portion to node N2 of the high power level portion. Two thermocouples (resistors 40 and 43, conductive films 41 and 42) also connect to node N2. The other side of one thermocouple connects to output means 45; the other side of the remaining thermocouple connects to ground.

THE COMPLETE SYSTEM (FIG. 4)

FIG. 4 shows a complete system in which the sensor 30 is connected to an output separation circuit 50, which, in turn, feeds two different chopper amplifiers 51 and 52 via a ground line 53, a d-c line 54 from the output 45, and a d-c line 55 from the output 35. Output from the high level sensor portion goes to the amplifier 51 by the output 45 and the line 54, and output from the low level sensor portion goes to the amplifier 52 by the output 35 and a line 55. Chopper amplifiers 51 and 52 convert their d-c input signals to a-c square waves, and amplify the square waves. Then the amplified square waves are synchronously detected, and the resulting d-c signals drive meters 56 and 57, respectively. The amplifiers 51 and 52 and their meters 56 and 57 are connected at all times but it is apparent that a switch could be inserted to disable the inappropriate circuit. It is also possible to achieve the switching at the output separation circuit 50 and use a single chopper amplifier, synchronous detector and meter to serve both sensors.

THE SENSOR 60 OF THE PRESENT INVENTION (FIG. 5)

As shown in FIG. 5, a sensor 60 may employ a thin film circuit substrate. For example, the RF structure of the sensor 60 may be fabricated on a 0.63-mm-thick sapphire substrate 61, using thin-film microelectronics technology. It may have grounded outer conductors 62 of a thin film co-planar waveguide and a thin film gold center conductor 63 of the co-planar wave guide. Input RF power is applied via a gold ribbon contact 64 to a blocking capacitor chip 65, and a bonded gold ribbon 66 connects the chip 65 to the center conductor 63.

For the incident radio-frequency power, beam lead diodes 67 and 68 are in parallel with a thermocouple chip 70 comprising two independent thermocouples, each of which preferably comprises a 100-ohm (or twice the $R_0$ value) resistance. The resistances are in parallel for incident microwave power, but in series for the d-c output. Thus, the d-c output from the thermocouple sensor can be taken from an RF ground point, namely via a broadband bypass capacitor 71 and a bonded gold ribbon 72 to a thermocouple sensor output 73. This output is used in the high power ranges.

The diodes 67 and 68 are connected to the center conductor of the co-planar waveguide in one of the classical configurations of a voltage doubler rectifier. Thus, the diode 67 is connected between the center conductor and the outer conductor of the co-planar waveguide, and the diode 68 is connected between the center conductor of the co-planar waveguide and the outer conductor through a bypass capacitor 75. The components involved in this rectification process are the blocking capacitor 65, the diodes 67 and 68, and the capacitor 75. The capacitor 75 is connected to a capacitor 76 in parallel. The capacitor 76 is connected to a diode sensor output 80, and there is a ground 81. The output 80 is used in the low power ranges.

Co-planar line is particularly attractive in this application, because the ground plane can be brought arbitrarily close to the center conductor by a simple taper. This allows the thermocouple chip to be attached with a minimum of parasitic inductance. Low parasitics are essential to achieving a low reflection coefficient and therefore a low mismatch uncertainty.

An embodiment of this scheme was built and tested over the power level range from −70 dBm to +20 dBm at 8 GHz. Both sensor portions performed as expected with the low level portion maintaining square-law operation up to −20 dBm and the high level portion providing good output above −30 dBm. Thus, switching between sensor portions could be done anywhere in a 10 dB overlap region, thereby showing that the scheme is quite feasible.

ALTERNATIVE CIRCUITS (FIGS. 6 TO 8)

Figure 6:
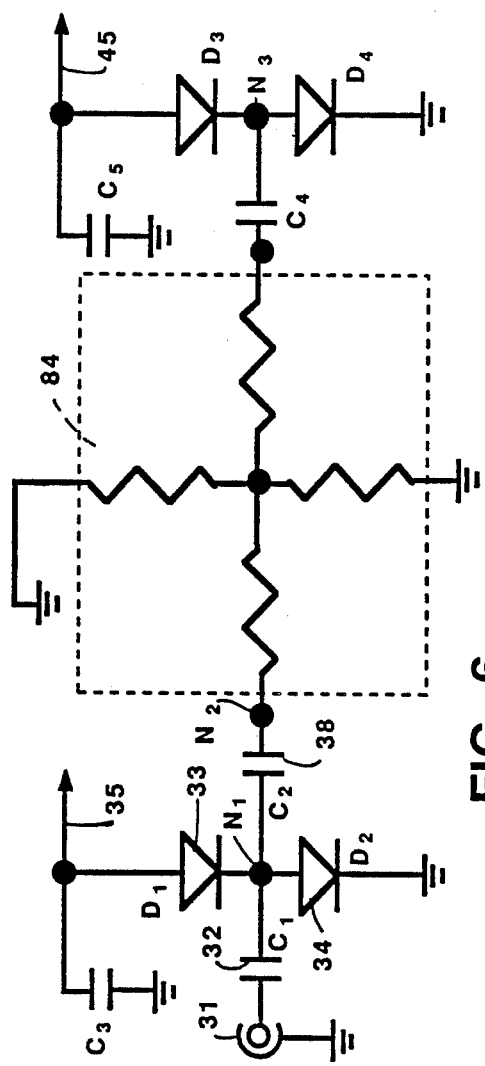
FIG. 6 is an alternate form of the circuit of FIG. 3 in which the high power level portion utilizes diodes preceded by an attenuator

An alternative to the circuit shown in FIG. 3 is shown in FIG. 6, where the high power level portion utilizes diodes D3 and D4 preceded by a resistive attenuator 84. These diodes join at node N3. One side of attenuator 84 connects directly to node N2 and the other side connects to node N3 via capacitor C4. Diode D3 is connected to a fifth grounded capacitor C5, this junction forming the output means 45. Diode D4 is connected to ground. The attenuator is comprised by a thin film resistor, or a ladder network of thin film resistors, connected between node N2 and capacitor C4.

Figure 7:
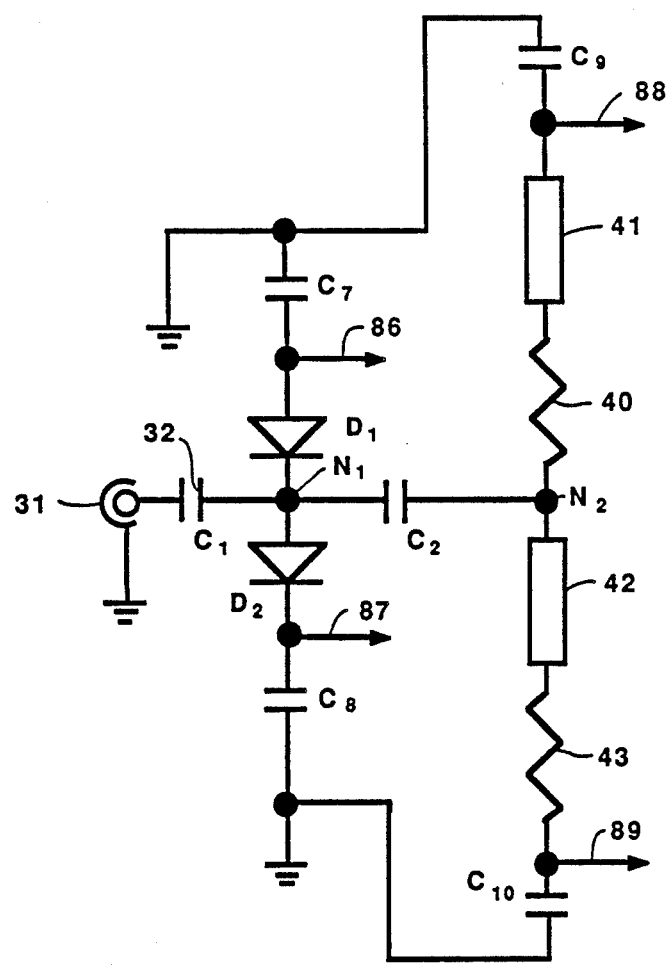
FIG. 7 is a diagram of a modified sensor circuit embodying the principles of the invention, with outputs suitable to drive balanced amplifiers.

FIG. 7 shows a wide dynamic range power sensor circuit suitable to drive a balanced electronic amplifier. It is very similar to FIG. 3 except for two main differences: first, the diode of the low power portion which is shown connected to ground in FIG. 3, now connects to a bypass capacitor C8 to comprise the output means 87 in FIG. 7; second, the thermocouple of the high power portion which is shown connected to ground in FIG. 3, now connects to a bypass capacitor C10 to comprise the output means 89 in FIG. 7. Balanced-output means 86 and 87 then provide the output signal from the low level portion, and the balanced-output means 88 and 89 provide the output signal from the high level portion. In a well balanced realization, capacitor C2 may be replaced with a direct connection between nodes N1 and N2, but including C2 probably is better.

Figure 8:
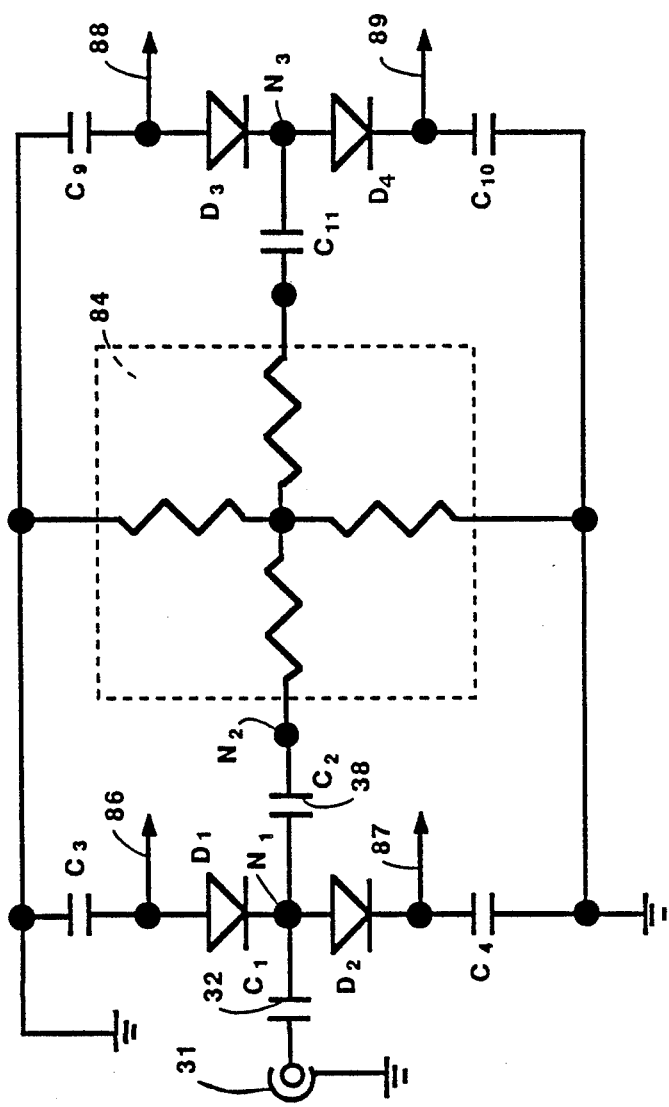
FIG. 8 is an alternate form of the circuit of FIG. 7 utilizing, at the high power portion, diodes connected to an attenuator.

FIG. 8 shows a balanced arrangement in which the high level portion, instead of thermocouples, uses an attenuator and a pair of diodes. It can be developed from the single-ended arrangement of FIG. 6 by lifting the grounded diodes D2 and D4 from ground and connecting them instead to bypass capacitors C4 and C10, respectively, thus forming output means 87 and 89, respectively. Balanced-output means 86 and 87 then provide the output signal from the low level portion, and the balanced-output means 88 and 89 provide the output signal from the high level portion. Capacitors C2 and C11 may each be replaced by direct connections without affecting the basic operation of the circuit.

To those skilled in the art to which this invention relates, many changes in construction and widely differing embodiments and applications of the invention will suggest themselves without departing from the spirit and scope of the invention. The disclosures and the descriptions herein are purely illustrative and are not intended to be in any sense limiting.

What is claimed is:

1. A wide dynamic range radio-frequency power sensor; comprising:
   an input port having one side grounded;
   a low power sensor portion capacitively coupled to said input port with d-c blocking;
   a high power sensor portion capacitively coupled to said input port in parallel with said low power sensor portion;
   first, and second direct-current output means coupled respectively to said low and high power sensor portions; and
   capacitance means coupled to said first and second direct current output means for grounding alternating current from each said sensor portion, said low power sensor portion comprising identical first and second diodes, said first diode being connected to said first direct-current output means and said second diode being connected to ground.

2. The power sensor of claim 1 wherein said first and second diodes are low barrier Schottky diodes.

3. The power sensor of claim 1 wherein said first and second diodes are planar doped epitaxial low barrier gallium arsenide diodes.

4. The power sensor of claim 1 wherein said high power sensor comprises first and second thermocouples, said first thermocouple being connected to said second output means and said second thermocouple being connected to ground; said thermocouples each consisting of a load resistor and a junction between dissimilar materials arranged so that said load resistors combine to function as the radio-frequency load for the entire wide dynamic range sensor.

5. The power sensor of claim 1 wherein said high power sensor portion comprises:
a resistive attenuator capacitively coupled to said low power portion; and
third and fourth diodes capacitively coupled to the output of said attenuator, said third diode being connected to said second output means and said fourth diode being connected to ground.

6. The power sensor of claim 1 wherein said low power sensor portion is connected to said first output means and said high power sensor portion is connected to said second output means.

7. The power sensor of claim 1 wherein both said first and second output means are grounded for radio-frequencies.

8. A wide dynamic range radio-frequency power sensor comprising:
an input port having one side grounded;
a diode sensor portion capacitively coupled to said input port with d-c blocking;
a thermocouple sensor portion capacitively coupled to said input port in parallel with said diode sensor portion;
first and second direct-current output means; and
capacitance means for grounding alternating current from each said sensor portion, said diode sensor portion comprising identical first and second diodes, said first diode being connected to said first output means, said second diode being connected to ground, said thermocouple sensor comprising first and second thermocouples, said first thermocouple being connected to said second direct-current output-means, and said thermocouple being connected to ground.

9. The power sensor of claim 8 wherein said first and second diodes are low barrier Schottky diodes.

10. The power sensor of claim 8 wherein said first and second diodes are planar doped epitaxial low barrier gallium arsenide diodes.

11. A wide dynamic range radio-frequency power sensor; comprising:
an input port having one side grounded;
a first coupling capacitor connected to said input port;
a diode sensor portion connected to said first coupling capacitor;
a second coupling capacitor connected to said first coupling capacitor and to said diode sensor portion;
a thermocouple sensor portion connected to said second coupling capacitor; and
first and second output means, said diode sensor portion comprising identical first and second diodes, both connected to said first coupling capacitor, said first diode and a grounded third capacitor being connected to said first output means, said second diode being connected to ground, said thermocouple sensor comprising first and second thermocouples, said first thermocouple and a grounded fourth capacitor being connected to said second output means, said second thermocouple being connected to ground.

12. The power sensor of claim 11 wherein said first and second diodes are low barrier Schottky diodes.

13. The power sensor of claim 11 wherein said first and second diodes are planar doped epitaxial low barrier gallium arsenide diodes.

14. A wide dynamic range radio-frequency power sensor comprising:
a substrate;
a thin-film ground conductor of co-planar wave guide on said substrate;
a thin-film central conductor of co-planar wave guide on said substrate separated from said ground conductor;
a ribbon contact at one end of said substrate providing an input port;
a blocking capacitor chip on said substrate connected to said input port; and connected to said thin film central conductor;
a pair of beam-lead diodes connected to said central conductor;
a pair of capacitors connected to one said beam-lead diode and connected so that the two capacitors are parallel;
a diode output terminal connected to said parallel capacitors; and
a thermocouple load chip on said substrate, connected to said central conductor through a capacitor, a bypass capacitor connected to said thermocouple and to a thermocouple sensor output, and a ground terminal connected to said substrate and to said ground conductor.

15. The sensor of claim 14 wherein said thin-film conductors and said ribbon contact are gold.

16. A wide dynamic range radio-frequency power sensor, comprising:
an input port having one side grounded;
a first diode sensor portion capacitively coupled to said input port with d-c blocking;
a second diode sensor portion capacitively coupled to said input port in parallel with said first diode sensor portion, said two portions each providing a direct-current output;
capacitance means for grounding alternating current from each said sensor portion, said first diode sensor portion comprising identical first and second diodes, said second diode being connected to ground, said second diode sensor portion comprising identical third and fourth diodes capacitively coupled to said first diode portion through a resistive attenuator, said fourth diode being connected to ground.

17. The power sensor of claim 16 wherein said first and second diodes and said third and fourth diodes are low barrier Schottky diodes.

18. The power sensor of claim 16 wherein said first and second diodes and said third and fourth diodes are planar doped epitaxial low barrier gallium arsenide diodes.

19. The power sensor of claim 16 wherein said first and third diodes are respectively connected to said first and second output means.

20. The power sensor of claim 16 wherein said first diode sensor portion and said second diode sensor portion each comprises a pair of diodes each connected to ground through a capacitor, with first output means comprising the pair of outputs formed by the connection of each said diode of said first diode sensor portion to its associated grounded capacitor, and second output means comprising the pair of outputs formed by the connection of each said diode of said second diode sensor portion to its associated grounded capacitor.

21. The power sensor of claim 16 wherein said low power sensor portion is connected to said first output means and said high power sensor portion is connected to said second output means.

22. A wide dynamic range radio-frequency power sensor comprising:
   an input port having one side grounded;
   a first coupling capacitor connected to said input port;
   a low power diode sensor portion connected to said first coupling capacitor;
   a second coupling capacitor connected to said first coupling capacitor and to said low power diode sensor portion;
   a high power diode sensor portion connected to said second coupling capacitor; and
   first and second output means, said low power diode sensor portion comprising identical first and second diodes, both connected through a first node to said first coupling capacitor, said first diode being connected to ground through a third capacitor, said first output means being located between said first diode and said third capacitor, said second diode being connected to ground, said second coupling capacitor being connected between said first node and a second node, said high power diode sensor comprising identical third and fourth diodes connected to a third node, through a fourth capacitor, said third node being connected to said second node through a resistive attenuator, said third diode being connected to ground through a fifth capacitor, said second output means being connected between said third diode and said fifth capacitor, said fourth diode being connected to ground.

23. A wide dynamic range radio-frequency power sensor comprising:
   an input port having one side grounded;
   a first coupling capacitor connected to said input port;
   a low power diode sensor portion connected to said first coupling capacitor;
   a second coupling capacitor connected to said first coupling capacitor and to said diode sensor portion;
   a high power thermocouple sensor portion connected to said second coupling capacitor; and
   first and second pairs of output members, said low power diode sensor portion comprising identical first and second diodes, both connected to said first coupling capacitor, said first diode being connected to a grounded third capacitor, a first output member of said first output pair being connected between said first diode and said third capacitor, said second diode being connected to a grounded fourth capacitor, a second output member of said first output pair, being connected between said second diode and said fourth capacitor, said thermocouple sensor comprising a first thermocouple that is connected to a first output member of said second output pair and to a grounded fifth capacitor, and a second thermocouple that is connected to a second output member of said second pair and to a grounded sixth capacitor.

24. A wide dynamic range radio-frequency power sensor comprising:
   an input port having one side grounded;
   a first coupling capacitor connected to said input port;
   a low power diode sensor portion connected to said first coupling capacitor through said first node;
   a second node connected to said second coupling capacitor;
   a high power diode sensor portion connected to said second coupling capacitor; and
   first and second pairs of output members; said low power diode sensor portion comprising identical first and second diodes, both connected through said first node to said first coupling capacitor, said first diode being connected to ground through a third, grounded capacitor and to a first output member of said first pair, said second diode being connected to ground through a fourth grounded capacitor and to a second output member of said first pair, said high power diode sensor comprising identical third and fourth diodes connected to a third node, said third node being connected to said second node through a fifth capacitor and a resistive attenuator, said third diode being connected to grounded sixth capacitor and a first output member of said second pair, said fourth diode being connected to grounded seventh capacitor and to a second output-member of said second pair.

25. An apparatus for measuring the power of an input radio-frequency signal to produce a low power range output signal and a high power range output signal indicative of the measured power, the apparatus comprising:
   a low power range sensing means for measuring the power of the input radio-frequency signal in a low power range to produce the low power range output signal;
   a high power range sensing means for measuring the power of the input radio-frequency signal in a high power range to produce the high power range output signal;
   a load means; and
   means for coupling the low power range sensing means, the high power sensing means and the load means to the input means such that the load means provides a load for both sensing means.

26. Apparatus of claim 25 wherein the low power range sensing means comprises a diode power sensor without a load, the high power range sensing means comprises a thermocouple power sensor with a resistive load, and the load means is provided for both sensors by the resistive load of the thermocouple power sensor.

27. Apparatus of claim 26 wherein both the low power range sensing means and high power range sensing means comprise diode power sensors, and a resistive network acts both as an attenuator for the high power diode power sensor and the load means for both sensors.

28. An apparatus for sensing the power of a radio-frequency signal over a range of signal powers of an input signal without necessarily attenuating the signal fed to the low power sensor portion, the apparatus comprising:
   first sensing means for sensing the power of a radio-frequency signal over a low range of signal powers;
   second sensing means for sensing the power of a radio-frequency signal over a high range of signal powers;

means for coupling the first sensing means and the second sensing means to the input signal such that both sensing means are connected at the same time.

29. An apparatus for sensing the power of a radio-frequency signal over a range of signal powers of an input signal, the apparatus comprising:
first sensing means for sensing the power of a radio-frequency signal over a low range of signal powers;
second sensing means for sensing the power of a radio-frequency signal over a high range of signal powers;
means for coupling the first sensing means and the second sensing means to the input signal such that both sensing means are connected at the same time, the low range of signal powers of the first sensing means and high range of signal powers of the second sensing means together covering the range of power levels of the input signal.

30. An apparatus for sensing the power of a radio-frequency signal over a range of signal power levels of an input signal, the apparatus comprising:
first sensing means for sensing the power of a radio-frequency signal over a low range of signal powers, the first sensing means requiring a resistive load;
second sensing means for sensing the power of a radio-frequency signal over a high range of signal powers, the second sensing means having a resistive load; and
means for coupling the first sensing means and the second sensing means to the input signal such that the second sensing means provides the resistive load for the first sensing means and the input signal is connected to only one resistive load over the range of input powers of the input signal, the low range of signal powers of the first sensing means and high range of signal powers of the second sensing means together covering the range of powers of the input signal.

31. An apparatus for measuring the power of an input radio-frequency signal to produce a plurality of power output signals, wherein each power output signal is indicative of the measured power for a separate range of power outputs, the apparatus comprising:
a plurality of power sensing means for measuring the power of the input radio-frequency signal in separate power ranges to produce the plurality of power output signals;
a load means; and
means for coupling the plurality of power sensing means and the load means to the input means such that the load means provides a load for the plurality of power sensing means.

32. An apparatus for measuring the power of an input radio-frequency signal from an input means to produce a plurality of power output signals, wherein each power output signal is indicative of the measured power for a separate range of power outputs, the apparatus comprising:
a plurality of power sensing means for measuring the power of the input radio-frequency signal in separate power ranges to produce the plurality of power output signals;
a load means;
means for coupling the plurality of power sensing means and the load means to the input means such that the load means provides a matched load for the input means; and
wherein all the power sensing means comprise diode power sensors, and wherein the load means comprises a plurality of resistive networks acting both as attenuators for at least some of the diode power sensors and as a matching load for the input means.

* * * * *